(12) United States Patent
Yeh et al.

(10) Patent No.: US 6,721,204 B1
(45) Date of Patent: Apr. 13, 2004

(54) MEMORY ERASE METHOD AND DEVICE WITH OPTIMAL DATA RETENTION FOR NONVOLATILE MEMORY

(75) Inventors: Chih Chieh Yeh, Taipei (TW); Wen Jer Tsai, Hualien (TW); Tao Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/465,395

(22) Filed: Jun. 17, 2003

(51) Int. Cl.$^7$ ............................................. G11C 16/34
(52) U.S. Cl. ..................... 365/185.24; 365/185.19; 365/185.18; 365/185.27; 365/185.29
(58) Field of Search ................. 365/185.18, 185.24, 365/185.28, 185.19, 185.22, 185.27, 185.29

(56) References Cited

U.S. PATENT DOCUMENTS

| | | | |
|---|---|---|---|
| 4,486,859 A | * 12/1984 | Hoffman | ................ 365/185.08 |
| 5,768,192 A | 6/1998 | Eitan | ..................... 365/185.24 |

* cited by examiner

Primary Examiner—Andrew Q. Tran
(74) Attorney, Agent, or Firm—Baker & McKenzie

(57) ABSTRACT

The invention advantageously provides a nonvolatile memory device and associated methods therefore, and, more particularly, an optimally designed nonvolatile memory device and methods therefor that advantageously prevent data loss in its trapping layer. A preferred embodiment of the method for operating a nonvolatile memory cell according to the invention advantageously comprises the steps of programming the memory cell, injecting electrons into a trapping layer of the memory cell from a semiconductor substrate, erasing the memory cell, detrapping the memory cell, and repeating the erasing and detrapping steps until a threshold voltage of the memory cell reaches a predetermined value. For the detrapping step, electrons can be detrapped from the trapping layer to a channel region of the memory cell, or to a gate of the memory cell. The method according to the invention can further include the steps of verifying the state of the trapping layer (high or low), and repeating the erasing and detrapping steps if the state of the trapping layer is not verified.

40 Claims, 9 Drawing Sheets

MEMORY ERASE METHOD AND DEVICE WITH OPTIMAL DATA RETENTION FOR NONVOLATILE MEMORY

BACKGROUND OF THE INVENTION

1. Field of the Invention

The invention generally relates to semiconductor memory devices and, more particularly, to a memory programming and erase method and device with optimal data retention for a nonvolatile memory.

2. Description of the Related Art

Memory devices for nonvolatile storage of information are commonly available in the art. Exemplary nonvolatile semiconductor memory devices include read only memory (ROM), flash memory, programmable read only memory (PROM), erasable programmable read only memory (EPROM), electrically erasable programmable read only memory (EEPROM) and flash EEPROM.

Flash EEPROMs are similar to EEPROMs in that memory cells can be programmed (i.e., written) and electrically erased. Flash EEPROMs further include the additional capability of erasing all memory cells therein at once. The common use of EEPROM semiconductor memory has prompted the development of an EEPROM memory cell with optimal performance characteristics, e.g., shorter programming times, lower voltage usage for programming and reading, longer data retention time, shorter erase time, smaller and miniaturized physical dimensions.

FIG. 1 is a block diagram that illustrates the structure of a prior art nonvolatile memory cell where a nonvolatile memory cell 70 includes an N-channel MOSFET structure. The nonvolatile memory cell 70 includes a P type substrate 706 with two buried N+ junctions, one being source 700 and the other being drain 701. A channel 707 is formed between the source 700 and the drain 701. Above the channel 707 is a first isolating layer 703, which generally is a silicon oxide layer. On top of the first isolating layer 703 is a trapping layer 704, which generally is a nitride layer. The trapping layer 704 forms the memory retention layer that traps the hot electrons as they are injected into the nitride layer. A second isolating layer 705, which generally is an oxide layer, is formed to overlay the silicon nitride layer. The silicon oxide layer 705 electrically isolates a conductive gate 702 formed over the second isolating layer 705. The two silicon oxide layers 703 and 705 function as isolation dielectric layers.

The prior art structure shown in FIG. 1 provides a two-bit memory cell, where the cell can store two bits of data. By applying programming voltages to the gate 702 and the drain 701 as the source 700 is grounded, electrons are sufficiently accelerated to be injected into the trapping layer 704 near the drain side 701. The electrons are injected so as to increase the energy barrier in the channel 707 near the drain side 701 where a bit of data is stored therein. Electrons can also be injected into the trapping layer 704 near the source side 702 to increase the energy barrier in the channel 707 near the source side 701 where another bit of data is stored therein. With an appropriate width for the trapping layer 704, the two areas or regions storing electrons in the trapping layer 704 can be accordingly identified and used for storing two bits of data. When no charge is stored in the trapping layer, the energy barrier in the channel 707 is in a low threshold voltage state. The memory cell is utilized in storing data by erasing it to a low threshold voltage state and programming to a high threshold voltage state. In programming the nonvolatile memory cell, the electrons are injected into the trapping layer near, e.g., the drain 701, so that the energy barrier in the channel 707 near the drain 701 is increased. When the electrons are injected into the trapping layer 704 near the source 700, the energy barrier in the channel 707 near the source 700 is increased. The energy barrier in the channel 707 thus includes two high-level sections distributed at two sides of the energy barrier.

The nonvolatile memory cell involves the trapping of electron charges in a trapping layer therein. The trapping layer is generally in a neutral state. When no charges are stored in the trapping layer, the energy barrier is in a low threshold voltage state. In operating the nonvolatile memory cell, the electrons are injected into the trapping layer so that the energy barrier in the channel is increased. As the nonvolatile memory cell is repeatedly operated for a plurality of program/erase cycles, damages are done to the energy barrier of the isolating layer. Some of the trapped storage electrons in shallow traps in the trapping layer will escape through damaged spots, which result in data loss and retention failures. Such adverse effects are significant design and implementation shortcomings in prior art nonvolatile memory devices. Furthermore, prior art nonvolatile memory structures requires a particularly confined size, which impedes engineering efforts on size and cost reduction therefor.

Thus, there is a general need in the art for a nonvolatile memory device with an optimal two-bit cell structure, and more particularly, a nonvolatile memory device and associated methods therefor that overcome at least the aforementioned disadvantages of nonvolatile memory devices in the art. In particular, a need exists in the art for an optimally designed nonvolatile memory device and methods therefor that advantageously prevent data loss in its trapping layer.

SUMMARY OF THE INVENTION

The invention advantageously provides a nonvolatile memory device and associated methods therefore, and, more particularly, an optimally designed nonvolatile memory device and methods therefor that advantageously prevent data loss in its trapping layer. Various embodiments of the invention are applicable to a plurality of nonvolatile memory devices, including read only memory (ROM), flash memory, programmable read only memory (PROM), erasable programmable read only memory (EPROM), electrically erasable programmable read only memory (EEPROM), flash EEPROM, and, more particularly, silicon oxide-silicon nitride-silicon oxide (SONOS) nonvolatile memory and floating gate nonvolatile memory.

A preferred embodiment of the method for operating a nonvolatile memory cell according to the invention advantageously comprises the steps of programming the memory cell, injecting electrons into a trapping layer of the memory cell from a semiconductor substrate, erasing the memory cell, detrapping the memory cell, and repeating the erasing and detrapping steps until a threshold voltage of the memory cell reaches a predetermined value. For the detrapping step, electrons can be detrapped from the trapping layer to a channel region of the memory cell, or to a gate of the memory cell. The method according to the invention can further include the steps of verifying the state of the trapping layer and the memory cell (high or low threshold voltage), and repeating the erasing and detrapping steps if the state of the trapping layer and the memory cell are not verified.

Another preferred embodiment of the method for operating a nonvolatile memory cell according to the invention advantageously comprises the steps of programming the memory cell, injecting electrons into a trapping layer of the memory cell from a semiconductor substrate, erasing the memory cell, detrapping the memory cell using electrical field induced ejection, and repeating the erasing and detrapping steps until a threshold voltage of the memory cell reaches a predetermined value.

Another embodiment of the method for operating a nonvolatile memory cell according to the invention advantageously comprises the steps of programming the memory cell, injecting electrons into a trapping layer of the memory cell from a semiconductor substrate using hot electron injection, erasing the memory cell, detrapping the memory cell, and repeating the erasing and detrapping steps until a threshold voltage of the memory cell reaches a predetermined value. The detrapping step in the method according to this particular embodiment of the invention can be performed using electrical field induced ejection.

A preferred embodiment of a nonvolatile memory cell according to the invention advantageously comprises a semiconductor substrate, a drain, a source, a gate, a channel formed between the drain and the source, a first isolating layer above the channel, a trapping layer above the first isolating layer, a second isolating layer above the trapping layer, means for programming the memory cell, means for injecting electrons into the trapping layer from the semiconductor substrate, means for erasing the memory cell, and means for detrapping the memory cell. The erasing and detrapping of the memory cell are repeatedly performed until a threshold voltage of the memory cell reaches a predetermined value. For the detrapping of the memory cell, electrons can be detrapped from the trapping layer to the channel of the memory cell, or to the gate of the memory cell. The state of the trapping layer and the memory cell (high or low threshold voltage) can also be verified, where the erasing and detrapping of the memory cell are repeatedly performed if the state of the trapping layer and the memory cell are not verified.

BRIEF DESCRIPTION OF THE DRAWINGS

The preferred and other embodiments of the invention are described in further detail below in conjunction with the accompanying drawings (not necessarily drawn to scale), in which.

DETAILED DESCRIPTION OF PREFERRED EMBODIMENTS

The details of the invention will be described hereinafter in conjunction with the appended drawings. Those of ordinary skill in the art should understand that the following includes exemplary descriptions of the invention. Modifications and variations within the scopes and spirits of the invention are accordingly covered by the scope of the invention, which is defined by the appended claims and their equivalents.

Figure 1:
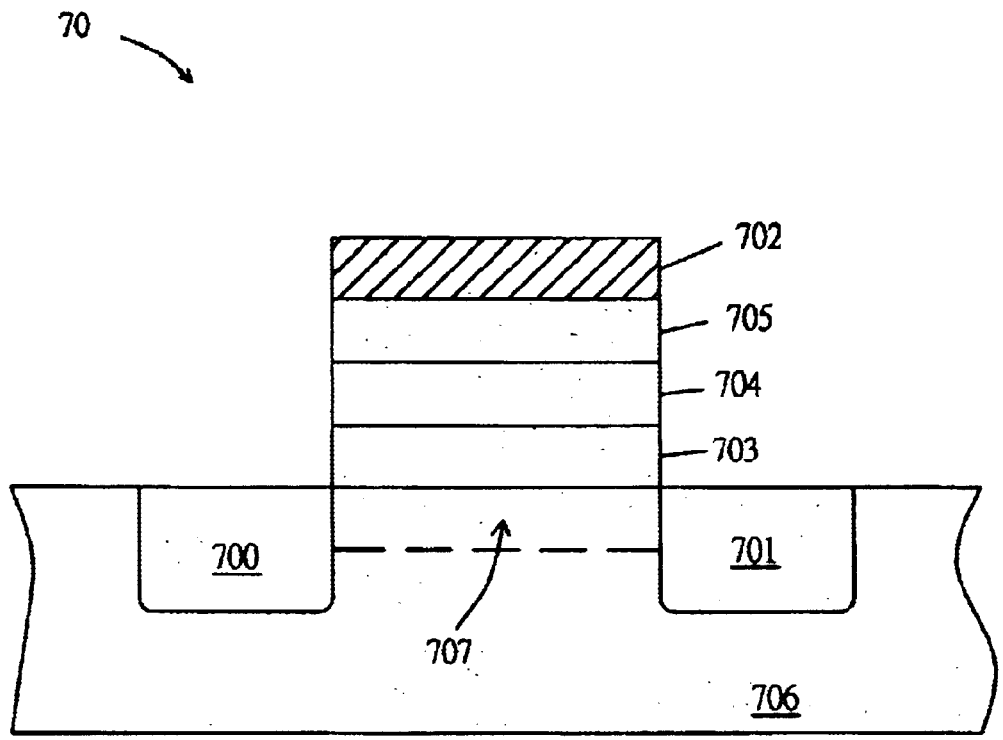
FIG. 1 is schematic view illustrating a nonvolatile memory cell in the prior art.
Figure 2:
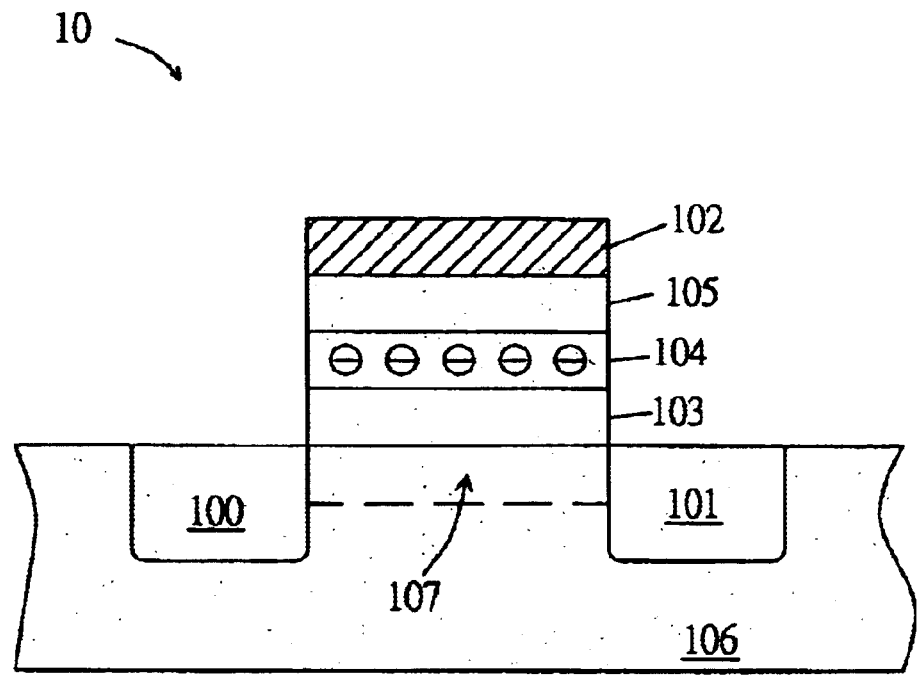
FIG. 2 is a schematic view illustrating a nonvolatile memory cell according to a general embodiment of the invention.

The nonvolatile memory cell 10 according to a general embodiment of the invention is illustrated in FIG. 2. The nonvolatile memory cell 10 generally includes an N-channel MOSFET structure. In the nonvolatile memory cell 10, a P type substrate 106 includes two buried N+ junctions, one being the source 100 and the other being the drain 101. A channel 107 is formed between the source 100 and the drain 101. Above the channel is a first isolating layer 103, which generally is a silicon oxide layer. On top of the first isolating layer 103 is a trapping layer 104, which generally is a nitride layer. The trapping layer 104 forms the memory retention layer for trapping the hot electrons as they are injected into the nitride layer. A second isolating layer 105, which generally is an oxide layer, is formed to overlay the silicon nitride layer. The silicon oxide layer 105 functions to electrically isolate a conductive gate 102 formed over the second isolating layer 105. The two silicon oxide layers 103 and 105 function as isolating dielectric layers.

Numerous advantages of the invention lie in the manner in which the nonvolatile memory cell 10 is programmed, read and erased. In the erase state, electrons are stored in the nitride layer so that the energy level in the channel is generally in a high threshold voltage state. In programming the nonvolatile memory cell 10, electric holes are injected into the trapping layer 104 from the source 100 or the drain 101 so as to change the energy barrier in the channel at the source or the drain side.

Figure 3:
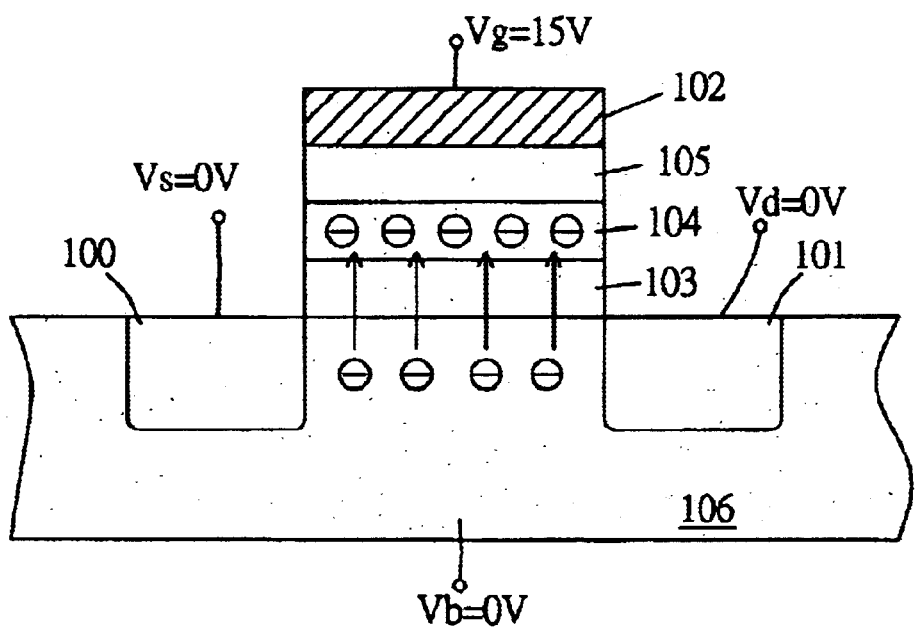
FIG. 3 is a schematic view illustrating an exemplary erase operation of the FN (Fowler-Nordheim) injection method according to an embodiment of the invention where electrons are injected into the trapping layer from the semiconductor substrate.

FIG. 3 is a schematic view that illustrates an exemplary erase operation of the Fowler-Nordheim (FN) injection method according to an embodiment of the invention where electrons are injected into the trapping layer from the semiconductor substrate. The nonvolatile memory cell according to the invention is erased using uniform electron injection by Fowler-Nordheim tunneling with a positive gate-to-drain/source/substrate bias for substrate injection.

To erase the nonvolatile memory cell, a substrate injection method is utilized. Voltages are applied to the source 100, drain 101, and the gate 102. For example, a voltage of 15 V is applied to the gate and a voltage of OV is applied to the drain 101, substrate 106 and source 100. These voltages generate a vertical electric field along the channel region to the gate 102. This electric field causes electrons to be drawn out of the channel region, which then accelerate towards the gate. The electrons are able to tunnel through the potential barrier of the silicon oxide layer 103 to be injected into the trapping layer 104 where they are trapped. The accelerated electrons are injected into the nitride layer where they are trapped and remain stored therein.

For a trapping storage non-volatile memory, the erase operation is performed by channel electron injection. A detrapping operation is applied after electron erasing. The FN detrapping is performed using electrical field induced ejection with negative or positive gate to source/drain/substrate bias. After an erase operation, some electrons may still be trapped in shallow traps of nitride, which will escape during data retention, resulting in reliability issues. By applying the detrapping step after electron injection, the electrons in the shallow traps are detrapped where the residual electron traps will be in deep traps from which electrons will not escape in retaining data.

Figure 4:
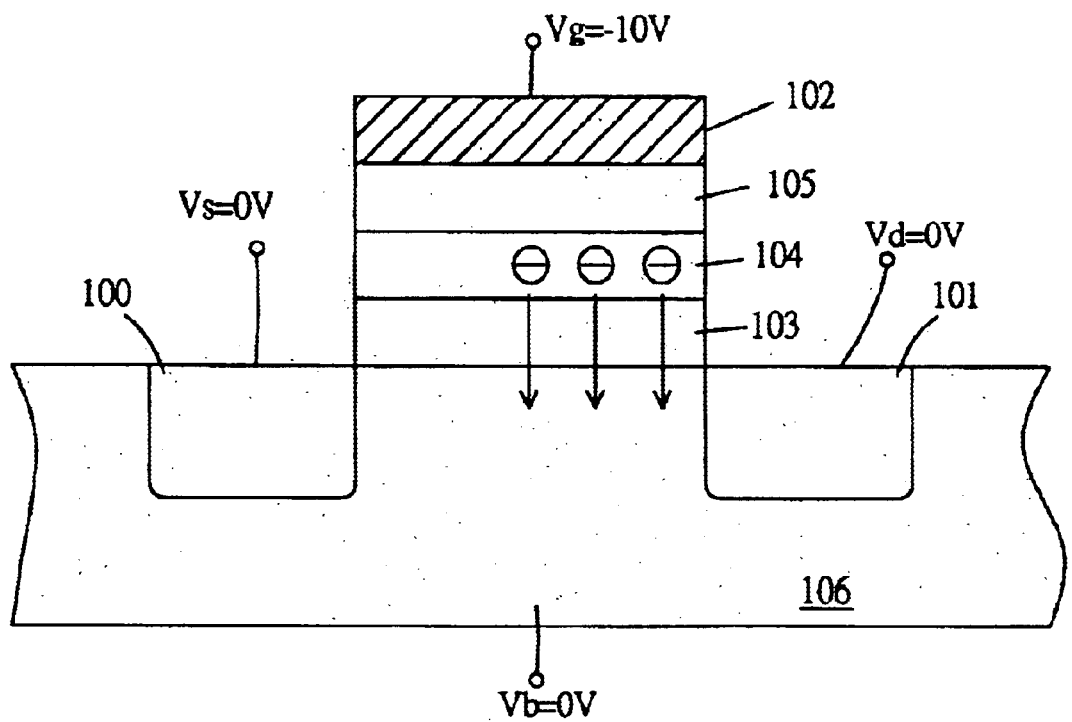
FIG. 4 is a further schematic view illustrating an exemplary detrapping operation method according to an embodiment of the invention where electrons are ejected from the trapping layer to the semiconductor substrate.

FIG. 4 is a schematic view that illustrates an exemplary detrapping operation method according to an embodiment of the invention where electrons are ejected from the trapping layer into the semiconductor substrate. The nonvolatile memory cell according to the invention is detrapped using electrical field induced ejection with a negative gate-to-drain/source/substrate bias. Voltages are applied to the source 100, drain 101, substrate 106 and the gate 102. For example, a voltage of –10 V is applied to the gate and a voltage of OV is applied to the drain 101, substrate 106 and source 100. These voltages generate a vertical electric field along the channel region 106 to the gate 102. This electric field causes electrons to be drawn out of the trapping layer, which then tunnel towards the channel region. The electrons are then able to tunnel through the potential barrier of the silicon oxide layer 103 for injection into the channel region 107.

Figure 5A:
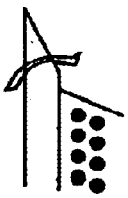
FIGS. 5A to 5I are schematic views illustrating a plurality of exemplary erase and detrapping operations according to the method of the invention.
Figure 5B:
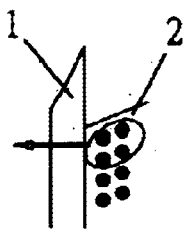
Figure 5C:
Figure 5D:
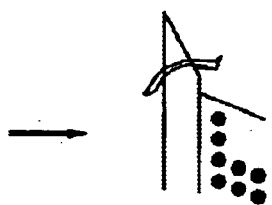
Figure 5E:
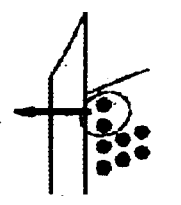
Figure 5F:
Figure 5G:
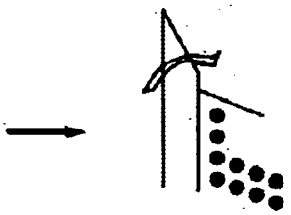
Figure 5H:
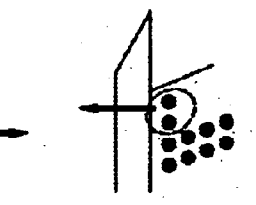
Figure 5I:
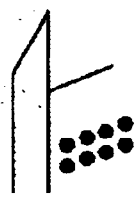

FIGS. 5A to 5I are schematic views that illustrate a plurality of exemplary erase and detrapping operations according to the method of the invention. In FIGS. 5A to 5I, plane I represents the magnitude of the energy barrier in the isolating layer 103, whereas plane 2 represents the magnitude of energy barrier in the trapping layer. For the erase operation, the electrons are injected into the trapping layer. Some of the electrons are trapped in the shallow traps and others are trapped in the deep traps. Some electrons are trapped in the shallow traps so that they can readily escape from the trapping layer through the damage spots, resulting in data loss and retention problems. Referring to FIG. 5B in particular, a detrapping process is applied to the trapping layer. The electrons in the shallow traps will escape from the trapping layer to the channel region 107, as illustrated in FIG. 5C. The erasing and detrapping are repeated until a threshold voltage achieves a desired or predetermined value, as illustrated in FIGS. 5A to 5I. Referring to FIG. 5C, the electrons in the trapping layer are relatively less than those shown in FIG. 5B. In FIG. 5D, the erase operation is executed again so that the electrons are injected into the trapping layer to further increase the number of trapped electrons in the trapping layer. Referring to FIG. 5E, a detrapping process is executed to detrap electrons in the trapping layer, which is subsequently verified in a verification process. These processes are repeatedly performed until the voltage threshold is above a predetermined value, as shown in FIGS. 5F and 5I.

Figure 6:
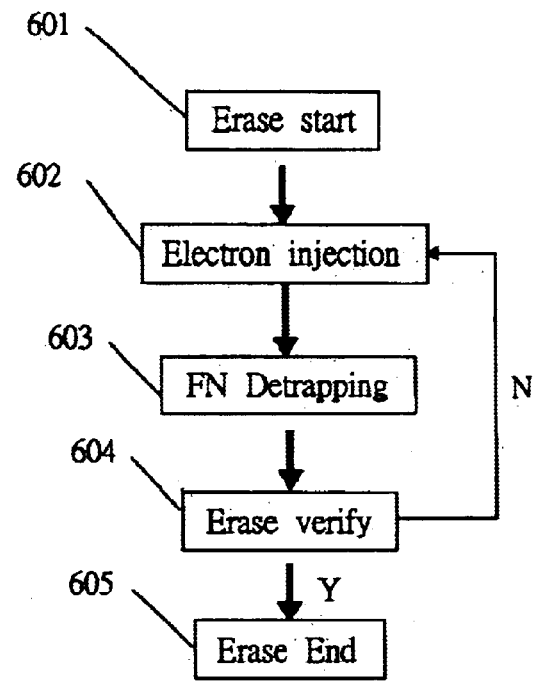
FIG. 6 is a flow diagram generally illustrating a preferred embodiment of the method according to the invention.

FIG. 6 is a flow diagram that generally illustrates a preferred embodiment of the method according to the invention, where an erase operation for a nonvolatile memory cell is initiated in step 601. In step 602, an electron injection operation in the nonvolatile memory cell is performed through an electron injection into the trapping layer. In step 603, a detrapping process is executed, where an electrical field induced ejection process is used to pump the electrons in the shallow traps out of the trapping layer. In step 604, the state of the trapping layer and the memory cell (i.e., high or low threshold voltage) is verified. If the state of the trapping layer and the memory cell is not verified, the control flow of the method according to the invention reverts back to the electron injection step 602. If the state of the trapping layer and the memory cell is verified, the control flow of the method according to the invention continues to step 605 where the erase operation ends.

The verify step 604 following the electron injection step 602 and detrapping step 603 is employed to ensure that a nonvolatile memory cell is erased to a desired level. If the state of the nonvolatile memory cell is not verified, the control flow of the method according to the invention reverts to the electron injection step 602. If the state of the nonvolatile memory cell is verified, the erasing operation is complete.

Figure 7:
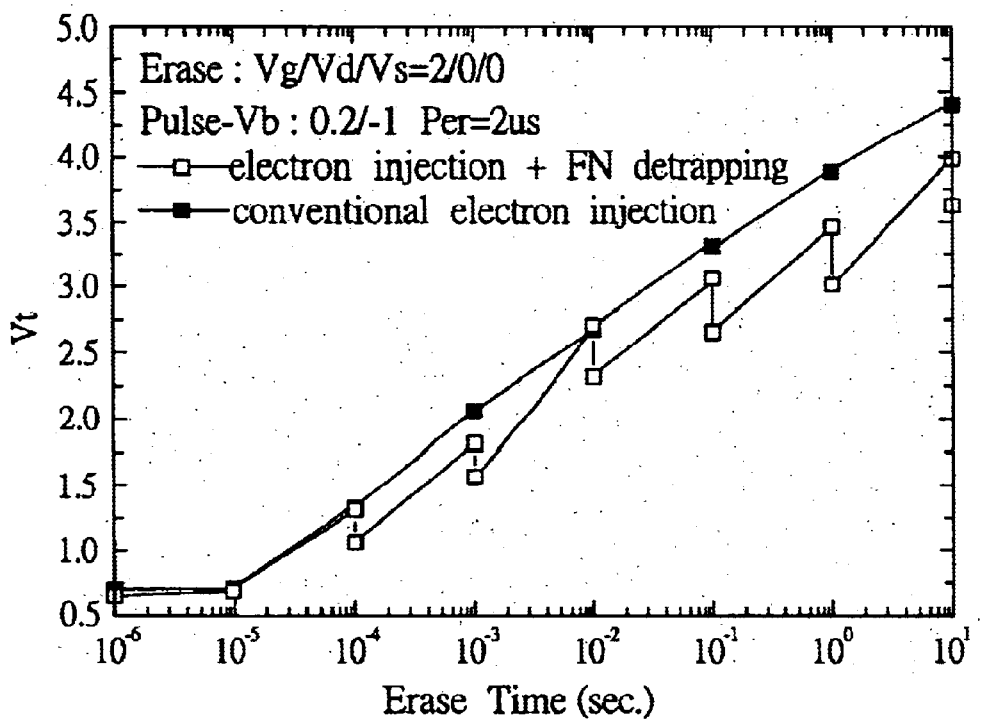
FIG. 7 is a graphical view illustrating the relationship between the voltage threshold and the erasing time according to the method of the invention under various testing conditions.

FIG. 7 is a graphical view that illustrates the relationship between the threshold voltage and the erasing time according to the method of the invention. The threshold voltage is measured between the gate 102 and the substrate 106, which is affected by the state of the trapping layer. If the trapping layer includes a relatively large number of electrons, the threshold voltage will accordingly increase. Two exemplary operations for a nonvolatile memory cell are illustrated in FIG. 7, including an erase operation using electron injection in the art, and an erase operation using election injection and detrapping according to the invention. For example, in erasing the nonvolatile memory cell, the voltage applied to the gate is generally 2 volts (V) and voltage applied to source and drain is 0. A series of pulses are used to inject electrons into the trapping layer. The width of the pulse is generally 0.2 $\mu$s and has a voltage of 0 and a lower voltage of –1 V. FIG. 7 is a graphical representation that the threshold voltage can be reached in a relatively short time interval in accordance with the method of the invention.

Figure 8:
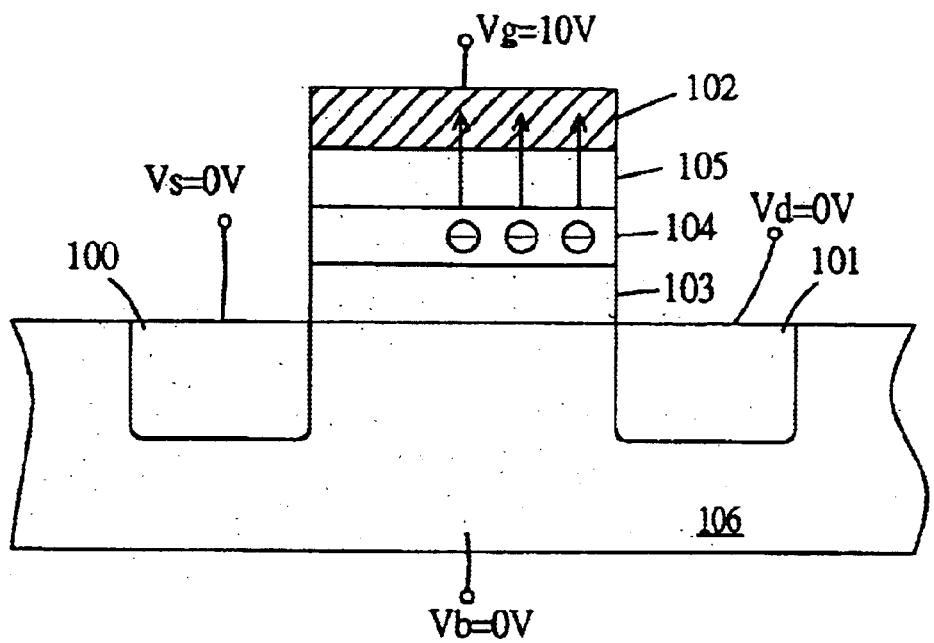
FIG. 8 is a schematic view illustrating another exemplary detrapping operation according the invention, where electrons are detrapped from the trapping layer to the gate.

Furthermore, voltages can be applied to erase a nonvolatile memory cell according to the invention using a positive gate-to-drain/source/substrate bias for substrate injection. FIG. 8 is a schematic view that illustrates another exemplary detrapping operation according the invention, where electrons are detrapped from the trapping layer to the gate using electrical field induced ejection. Voltages are accordingly applied to the source 100, the drain 101, substrate 106 and the gate 102. For example, a voltage of 10 V is applied to the gate and OV is applied to the drain 101, substrate 106 and source 100. These voltages generate a vertical electric field from the gate 102 to the nitride layer 104. This electric field causes electrons to be drawn off the trapping layer 104 and then to tunnel through the isolating layer 105. The erase and detrapping operations according to the invention are executed, as accordingly described herein and above. In erasing the nonvolatile memory cell, the electrons are injected into and captured by the trapping layer. However, some of the electrons are trapped in the shallow traps so that they can readily escape from the trapping layer through damage spots therein, resulting in data loss and retention problems. In applying a detrapping operation to the trapping layer and memory cell, the electrons in shallow traps will escape from the trapping layer to the gate region 102. The erase and detrapping operations are repeated until a voltage threshold reaches a desired or predetermined value.

There are generally two types of detrapping operation for detrapping electrons from the trapping layer of a nonvolatile memory cell. The first type of detrapping is to detrap electrons from the trapping layer to the channel of the nonvolatile memory cell. The second type of detrapping is to detrap electrons from the trapping layer to the gate region.

Figure 9:
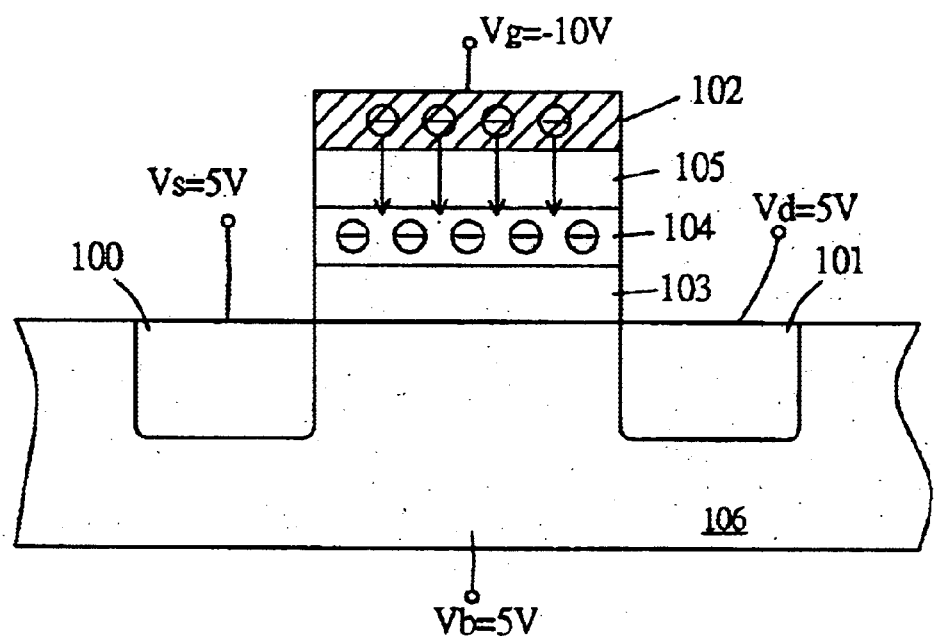
FIG. 9 is a schematic view illustrating another exemplary erase operation according the invention where electrons are injected into the trapping layer from the gate.

Voltages are applied in erasing a nonvolatile memory cell. A negative gate-to-drain/source/substrate bias is used for gate injection. FIG. 9 is a schematic view that illustrates another exemplary erase operation according the invention where electrons are injected into the trapping layer from the gate using Fowler-Nordheim (FN) injection method. Voltages are accordingly applied to the source 100, the drain 101, and the gate 102. For example, a voltage of −10 V is applied to the gate and 5 V is applied to the drain 101 and source 100. These voltages generate a vertical electric field from the gate 102 to the nitride layer 104. This electric field causes electrons to be drawn off the gate 102 and to accelerate towards the nitride layer 104. The electrons are able to tunnel through the energy barrier of the second isolation layer 105 into the trapping layer 104 where they are trapped. These accelerated electrons are injected into the trapping layer where they are trapped and remain stored therein. For detrapping the electrons from the trapping layer, electrical field induced ejection is applied, which can include the detrapping of electrons from the trapping layer to the channel of the nonvolatile memory cell, or detrapping of electrons from the trapping layer to the gate region.

Figure 10:
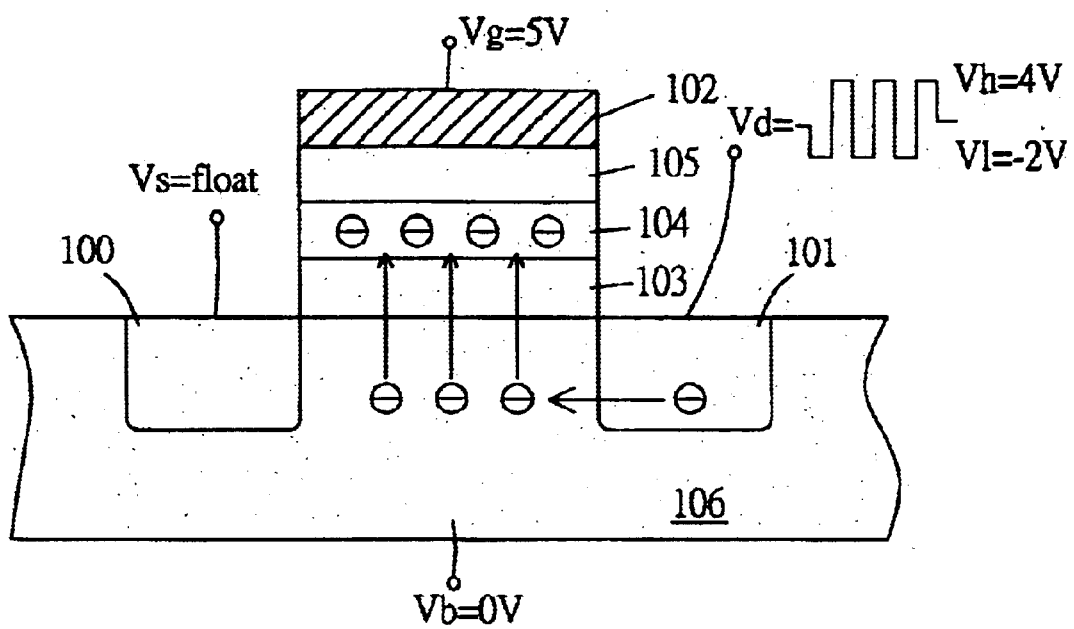
FIG. 10 is a schematic view illustrating an exemplary erase operation for the flash memory cell according the invention using hot electron injection from the drain by pulse agitating the substrate.

FIG. 10 is a schematic view that illustrates an exemplary erase operation for the flash memory cell according the invention. Hot electrons are injected from the drain by pulse agitating the substrate. The memory cell is erased by pulse-agitating the substrate with hot electron injection, where the gate 102 is positively biased, the source 100 is floated and the substrate is grounded, as a series of bipolar pulses are input to the drain 101. According to this particular embodiment of the invention, the voltage of the gate is generally 5 V, where the high voltage of the pulse is generally 4 V and the lower voltage thereof is −2 V. As a negative pulse is input to the drain 101, the electrons in the drain consequently flow out of the drain 101 to the source 100. When applying a positive pulse to the drain 101, an electric field is formed and the electrons flowing out of the drain 101 are directed to the gate 102 and are then trapped in the trapping layer 104 so as to complete the erase operation. In a further embodiment according to the invention, a series of pulses can be input from the source 100 with the drain being floated in achieving generally the same result. For detrapping the electrons from the trapping layer, electrical field induced ejection is applied, which can include the detrapping of electrons from the trapping layer to the channel of the nonvolatile memory cell, or detrapping of electrons from the trapping layer to the gate region.

Figure 11:
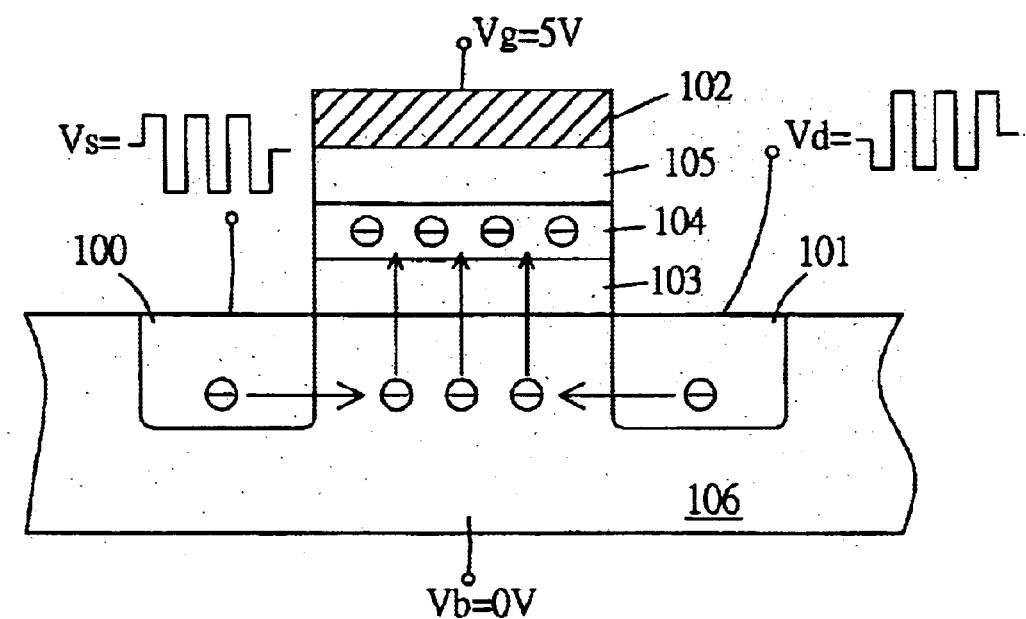
FIG. 11 is a schematic view illustrating another exemplary erase operation of the flash memory cell according to the invention using hot electron injection from the source and drain by pulse agitating the substrate.

FIG. 11 is a schematic view that illustrates yet another exemplary erase operation of the flash memory cell according to the invention using hot electron injection from the source and drain by pulse agitating the substrate. According to this particular embodiment of the invention, the gate 102 is positively biased and the substrate 106 is grounded. A series of bipolar pulses are input into the drain 101 and source 100 synchronously. When negative pulses are applied to the source 100 and drain 101, electrons are drawn off the source 100 and drain 101, which then accelerate towards the channel 107. As the positive pulses are applied to the source 100 and drain 101, a vertical electric field is generated along the path from the channel 107 to the gate 102. The vertical electric field pumps the electrons out of the source 100 and the drain 101 to pass through the first silicon oxide layer 103 to the trapping layer 104. After filling the trapping layer with electrons for a period of time, the trapping layer 104 is full of electrons so as to erase the original state in the nitride layer. For detrapping the electrons from the trapping layer, electrical field induced ejection is applied, which can include the detrapping of electrons from the trapping layer to the channel of the nonvolatile memory cell, or detrapping of electrons from the trapping layer to the gate region.

Figure 12:
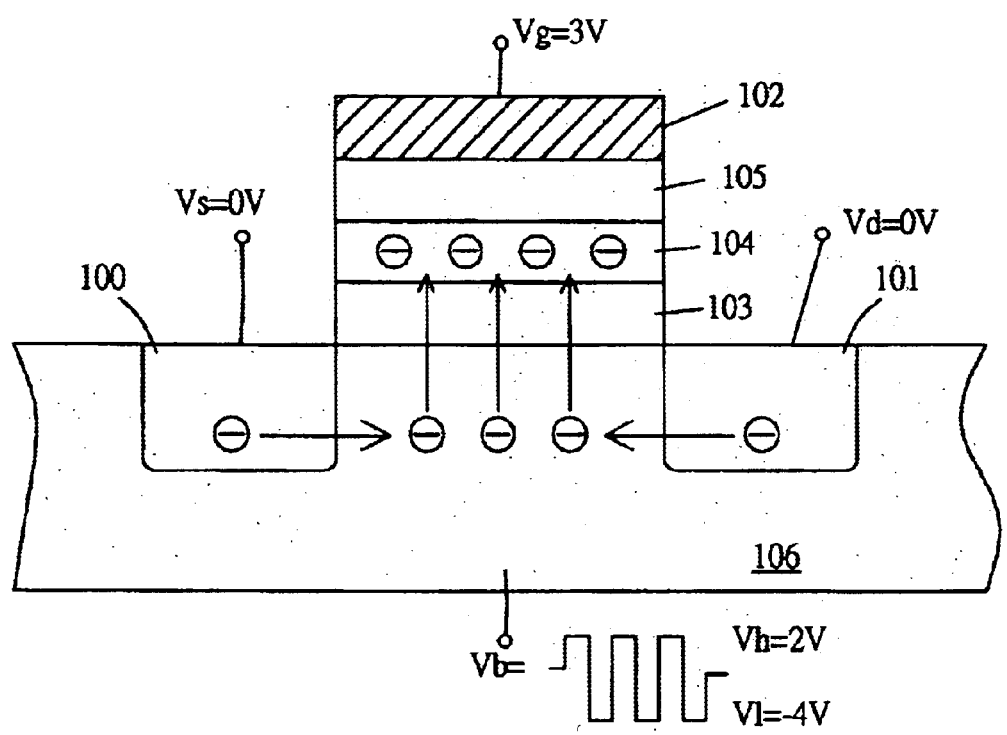
FIG. 12 is a schematic view illustrating yet another exemplary erase operation of the flash memory cell according to the invention using hot electron injection by pulse agitating the semiconductor substrate.

Moreover, the pulses can be directly applied to the substrate 106 for pumping electrons into the trapping layer. FIG. 12 is a schematic view that illustrates yet another exemplary erase operation of the flash memory cell according to the invention where hot electrons are injected into the trapping layer by pulse agitating the semiconductor substrate. A positive voltage of (e.g., 3 V) is applied to the gate 102 with the source 100 and the drain 101 being grounded. A series of pulses with a high state of 2 V (for example) and a lower level of −4 V (for example) are applied to the substrate 106. As a positive voltage is applied, electrons are drawn out of the source 100 and drain 101. As negative voltage is applied, the electrons out of the source 100 and drain 101 are pumped upwards to the trapping layer 104. After filling the trapping layer with electrons for a period of time, the trapping layer 104 is full of electrons so as to erase the original state in the nitride layer. For detrapping the electrons from the trapping layer, electrical field induced ejection is applied, which can include the detrapping of electrons from the trapping layer to the channel of the nonvolatile memory cell, or detrapping of electrons from the trapping layer to the gate region.

Figure 13:
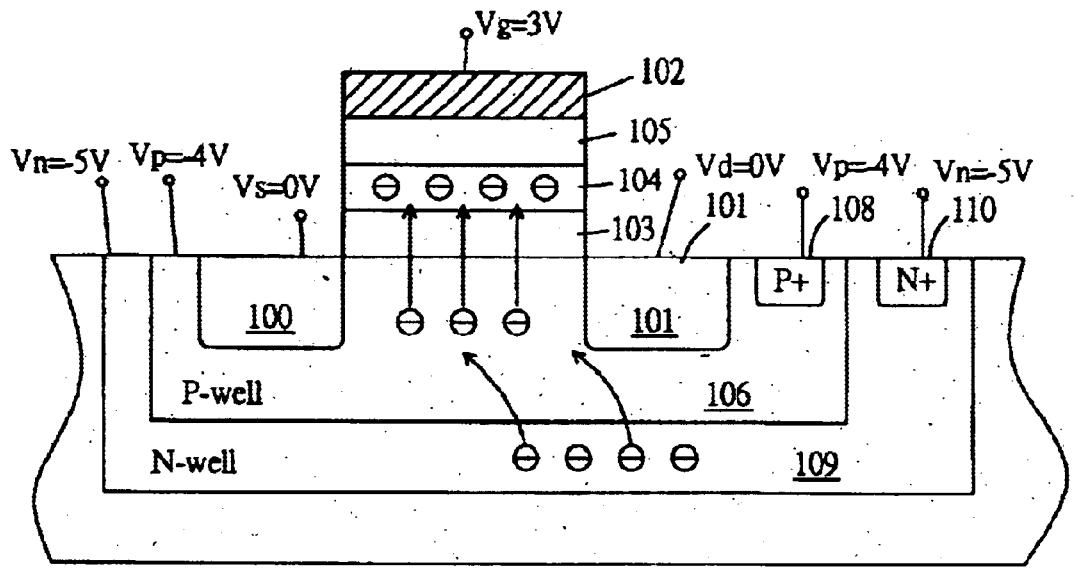
FIG. 13 is a schematic view illustrating a further exemplary erase operation of the nonvolatile memory cell according to the invention using hot electron injection.

FIG. 13 is a schematic view that illustrates a further exemplary erase operation of the nonvolatile memory cell according to the invention where hot electrons are injected into the trapping layer. The nonvolatile memory cell according to the invention is erased by hot electron injection, where an N well is provided around the semiconductor substrate of the nonvolatile memory cell. With a positive gate-to-drain/source bias, electrons are emitted from the N well, injected into the P well and trapped in the cell, where the substrate 106 acts as the P well according to this particular embodiment of the invention. An N well 109 is formed to enclose the substrate 106. A P+ area 108 is formed in the P well, which is located, but not limited, to the right side of the N+ drain area 101 according to this embodiment. The P+ area 108 is metalized to serve as a joint to be connected to an outer component. The N well 109 further encloses the P well and includes an N+ area 110. The N+ area 110 is located at, but not limited to, one side of the P+ area 108. The N+ area 110 is metalized to serve a joint to be connected to an outer component. A voltage is provided between the gate 102 and the N well 109 so as to pump electrons from the N well to the semiconductor substrate 106, which then flow to the trapping layer 104. The N well of this relatively large size, as illustrated in FIG. 12, advantageously provides a significantly large amount of electrons to be injected to the trapping layer with a relatively small voltage. For detrapping the electrons from the trapping layer, electrical field induced ejection is applied, which can include the detrapping of electrons from the trapping layer to the channel of the nonvolatile memory cell, or detrapping of electrons from the trapping layer to the gate region.

It should be understood that the particular amounts of voltages described herein and above in conjunction with FIG. 12 simply encompass one set of available conditions for performing the erase operation for the nonvolatile memory in accordance with the invention.

Figure 14:
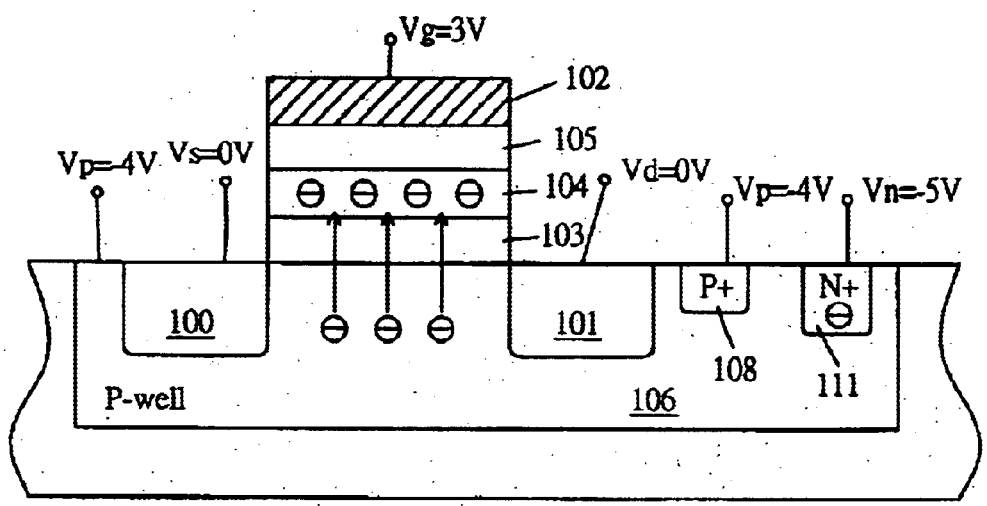
FIG. 14 is a schematic view illustrating an additional exemplary erase operation of the nonvolatile memory cell according to the invention using hot electron injection.

FIG. 14 is a schematic view that illustrates an additional exemplary erase operation of the nonvolatile memory cell according to the invention where hot electrons are injected into the trapping layer. The nonvolatile memory cell according to the invention is erased by hot electron injection, where an N+ injector is provided in the semiconductor substrate of the nonvolatile memory cell. With a positive gate-to-drain/source bias, electrons are emitted from the N+ injector, and then injected into the P well where they are trapped in the memory cell, where the substrate 106 acts as the P well according to this particular embodiment of the invention. An N+ injector 111 is formed in the P well, which serves to provide electrons to the P well. The electrons are then injected to the trapping layer 104. A P+ area 108 is formed in the P well. The P+ area 108 is metalized to serve as a joint to be connected to an outer component. According to this embodiment of the invention, the N+ injector 111 and P+ area 108 are located at, but not limited to, the right side of the N+ drain area 101. A voltage is provided between the gate 102 and the N+ injector 110 to pump electrons from the N+ injector into the P well, which electrons flow to the trapping layer 104. The N well of this relatively large size as illustrated in FIG. 12 advantageously provides a significantly large amount of electrons to be injected to the trapping layer with a relatively small voltage. For detrapping the electrons from the trapping layer, electrical field induced ejection is applied, which can include the detrapping of electrons from the trapping layer to the channel of the nonvolatile memory cell, or detrapping of electrons from the trapping layer to the gate region.

The invention advantageously provides a nonvolatile memory device and associated methods therefore, and, more particularly, an optimally designed nonvolatile memory device and methods therefor that advantageously prevent data loss in its trapping layer. Various embodiments of the invention are applicable to a plurality of nonvolatile memory devices, including read only memory (ROM), flash memory, programmable read only memory (PROM), erasable programmable read only memory (EPROM), electrically erasable programmable read only memory (EEPROM), flash EEPROM, and, more particularly, silicon oxide-silicon nitride-silicon oxide (SONOS) nonvolatile memory and floating gate nonvolatile memory.

Although the invention has been described with reference to the preferred embodiments, it will be understood that the invention is not limited to the details described thereof. Substitutions and modifications have been suggested in the foregoing description, and others will occur to those of ordinary skill in the art. In particular, the process steps of the method according to the invention will include methods having substantially the same process steps as the method of the invention to achieve substantially the same result. Therefore, all such substitutions and modifications are intended to be within the scope of the invention as defined in the appended claims and their equivalents.

We claim:

1. A method for operating a nonvolatile memory cell comprising the steps of:

(a) programming said memory cell;

(b) injecting electrons into a trapping layer of said memory cell;

(c) erasing said memory cell;

(d) detrapping said memory cell; and (e) repeating steps (c) and (d) until a threshold voltage of said memory cell reaches a predetermined value.

2. The method of claim 1 wherein step (b) is performed using Fowler-Nordheim (FN) injection.

3. The method of claim 1 wherein step (b) is performed using hot electron injection.

4. The method of claim 1 wherein step (d) is performed using electrical field induced ejection.

5. The method of claim 1 further comprising the step of pulse agitating a semiconductor substrate of said memory cell.

6. The method of claim 1 further comprising the step of inputting a series of bipolar pulses to a drain of said memory cell.

7. The method of claim 1 further comprising the step of inputting a series of bipolar pulses to a source of said memory cell.

8. The method of claim 1 further comprising the step of inputting a series of bipolar pulses to a source and a drain of said memory cell synchronously.

9. The method of claim 1 further comprising the step of inputting a series of bipolar pulses to a semiconductor substrate of said memory cell.

10. The method of claim 1 further comprising the step of grounding a semiconductor substrate of said memory cell.

11. The method of claim 1 further comprising the step of applying voltages to a drain, a source, and a gate of said memory cell.

12. The method of claim 1 further comprising the steps of:

generating an electric field along a channel region of said memory cell to a gate of said memory cell;

drawing some of said electrons out of said trapping layer; and injecting said drawn out electrons into said channel region.

13. The method of claim 1 wherein step (c) is performed with a positive gate-to-drain/source/substrate bias.

14. The method of claim 1 wherein step (d) is performed with a negative gate-to-source/drain/substrate bias.

15. The method of claim 1 wherein step (d) is performed with a positive gate-to-source/drain/substrate bias.

16. The method of claim 1 further comprising the step of verifying a state of said trapping layer.

17. The method of claim 16 wherein steps (c) and (d) are repeatedly performed if said state of said trapping layer is not verified.

18. The method of claim 1 wherein some of said electrons are detrapped from said trapping layer to a channel region of said memory cell.

19. The method of claim 1 wherein some of said electrons are detrapped from said trapping layer to a gate of said memory cell.

20. The method of claim 1 wherein said memory cell further comprises read only memory (ROM), flash memory, programmable read only memory (PROM), erasable programmable read only memory (EPROM), electrically erasable programmable read only memory (EEPROM), flash EEPROM, and silicon oxide-silicon nitride-silicon oxide (SONOS) nonvolatile memory and floating gate nonvolatile memory.

21. A nonvolatile memory cell comprising:
a semiconductor substrate;
a drain;
a source;
a gate;
a channel formed between said drain and said source;
a first isolating layer above said channel;
a trapping layer above said first isolating layer;
a second isolating layer above said trapping layer;
means for programming said memory cell;
means for injecting electrons into said trapping layer from said semiconductor substrate;
means for erasing said memory cell; and
means for detrapping said memory cell.

22. The memory cell of claim 21 wherein said memory cell is detrapped using electrical field induced ejection.

23. The memory cell of claim 21 wherein said memory cell is repeatedly erased and detrapped until a threshold voltage of said memory cell reaches a predetermined value.

24. The memory cell of claim 21 wherein said electrons are injected into said trapping layer from said semiconductor substrate using hot electron injection.

25. The memory cell of claim 21 wherein said electrons are injected into said trapping layer using Fowler-Nordheim (FN) injection.

26. The memory cell of claim 21 wherein a series of bipolar pulses is input to said drain of said memory cell.

27. The memory cell of claim 21 wherein a series of bipolar pulses is input to said source of said memory cell.

28. The memory cell of claim 21 wherein a series of bipolar pulses is input to said source and said drain of said memory cell synchronously.

29. The memory cell of claim 21 wherein a series of bipolar pulses is input to said semiconductor substrate.

30. The memory cell of claim 21 wherein said semiconductor substrate is grounded.

31. The memory cell of claim 21 wherein voltages are applied to said drain, said source, said gate, and said semiconductor substrate.

32. The memory cell of claim 21 further comprising an electric field generated along said channel to said gate of said memory cell wherein some of said electrons are drawn out of said trapping layer and injected into said channel.

33. The memory cell of claim 21 wherein said memory cell is erased with a positive gate-to-drain/source/substrate bias.

34. The memory cell of claim 21 wherein said memory cell is detrapped with a negative gate-to-source/drain/substrate bias.

35. The memory cell of claim 21 wherein said memory cell is detrapped with a positive gate-to-source/drain/substrate bias.

36. The memory cell of claim 21 wherein a state of said trapping layer is verified.

37. The memory cell of claim 36 wherein said memory cell is repeatedly erased and detrapped if said state of said trapping layer is not verified.

38. The memory cell of claim 21 wherein some of said electrons are detrapped from said trapping layer to said channel.

39. The memory cell of claim 21 wherein some of said electrons are detrapped from said trapping layer to said gate.

40. The memory cell claim 21 wherein said memory cell further comprises read only memory (ROM), flash memory, programmable read only memory (PROM), erasable programmable read only memory (EPROM), electrically erasable programmable read only memory (EEPROM), flash EEPROM, and silicon oxide-silicon nitride-silicon oxide (SONOS) nonvolatile memory and floating gate nonvolatile memory.

* * * * *